United States Patent
Liou et al.

(10) Patent No.: US 12,193,303 B2
(45) Date of Patent: Jan. 7, 2025

(54) ELECTRONIC DEVICE AND TRANSPARENT DISPLAY HAVING THE SAME

(71) Applicant: INDUSTRIAL TECHNOLOGY RESEARCH INSTITUTE, Hsinchu (TW)

(72) Inventors: Ying-Ting Liou, Zhudong Township (TW); Ruo-Lan Chang, New Taipei (TW); Wen-Yu Kuo, Zhudong Township (TW); Wen-Ya Chao, Hsinchu (TW); Wei-Chung Chen, Kaohsiung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 886 days.

(21) Appl. No.: 17/105,909

(22) Filed: Nov. 27, 2020

(65) Prior Publication Data

US 2022/0165808 A1  May 26, 2022

(30) Foreign Application Priority Data

Nov. 24, 2020 (TW) ................................. 109141180

(51) Int. Cl.
*H10K 59/35* (2023.01)
*H10K 59/121* (2023.01)
(Continued)

(52) U.S. Cl.
CPC ....... *H10K 59/353* (2023.02); *H10K 59/1213* (2023.02); *H10K 59/1216* (2023.02); *H10K 59/131* (2023.02); *H10K 59/873* (2023.02)

(58) Field of Classification Search
CPC ............. H10K 59/121; H10K 59/1213; H10K 59/1216; H10K 59/131; H10K 59/353; H10K 59/873
See application file for complete search history.

(56) References Cited

U.S. PATENT DOCUMENTS

| 10,636,838 B2 | 4/2020 | Pan |
| 2016/0018927 A1 | 1/2016 | Ding et al. |

(Continued)

FOREIGN PATENT DOCUMENTS

| CN | 209434190 U | 9/2019 |
| CN | 110911440 A | 3/2020 |

(Continued)

OTHER PUBLICATIONS

Taiwanese Office Action and Search Report, dated Jul. 6, 2021, for Taiwanese Application No. 109141180.

(Continued)

*Primary Examiner* — Brigitte A Paterson
(74) *Attorney, Agent, or Firm* — Birch, Stewart, Kolasch & Birch, LLP

(57) ABSTRACT

An electronic device includes a transparent substrate, a number of pixel structures and a first trace structure. The transparent substrate includes a transparent region and a trace region. Each of the pixel structures has a sub-pixel structure of first color and a sub-pixel structure of second color. The sub-pixel structure of first color has a light emitting element of first color. The sub-pixel structure of second color has a light emitting element of second color. The first trace structure includes a first main trace, a first auxiliary trace and a second auxiliary trace. The first main trace is disposed in the trace region and surrounds a portion of the transparent region. The first auxiliary trace and the second auxiliary trace are electrically connected to the first main trace, and are electrically connected to the corresponding sub-pixel structure of first color and the corresponding sub-pixel structure of second color, respectively.

17 Claims, 12 Drawing Sheets

(51) Int. Cl.
H10K 59/131 (2023.01)
H10K 59/80 (2023.01)

(56) References Cited

U.S. PATENT DOCUMENTS

| | | |
|---|---|---|
| 2017/0207249 A1 | 7/2017 | Rhee |
| 2020/0110525 A1 | 4/2020 | Park et al. |
| 2020/0236259 A1* | 7/2020 | Nakamura ............ H10K 59/65 |
| 2020/0302878 A1 | 9/2020 | Kato et al. |
| 2022/0165808 A1* | 5/2022 | Liou .................... H10K 59/873 |

FOREIGN PATENT DOCUMENTS

| | | |
|---|---|---|
| CN | 111007951 A | 4/2020 |
| CN | 111599283 A | 8/2020 |
| TW | 201023365 A1 | 6/2010 |
| TW | 201608318 A | 3/2016 |
| TW | I549291 B | 9/2016 |
| TW | 202119379 A | 5/2021 |

OTHER PUBLICATIONS

Rjoub et al., "Active Matrix Organic Light Emitting Diode Displays (AMOLED) New Pixel Design," Microelectronic Engineering, vol. 212, 2019 (Available online Apr. 4, 2019), pp. 42-52.

* cited by examiner

ELECTRONIC DEVICE AND TRANSPARENT DISPLAY HAVING THE SAME

This application claims the benefit of Taiwan application Serial No. 109141180, filed on Nov. 24, 2020, the disclosure of which is incorporated by reference herein in its entirety.

TECHNICAL FIELD

The disclosure relates in general to an electronic device and a transparent display having the same.

BACKGROUND

Recently, people's demand for transparent display is increasing. Furthermore, in order to enjoy a better display quality, consumers' demand for an increased aperture ratio also arises. However, traditional trace design employs a large number of traces which occupy a large area, thereby limiting the aperture ratio of the transparent display.

It has become a prominent task for the industries to provide a transparent display having a high aperture ratio and excellent display quality.

SUMMARY

According to one aspect of the present disclosure, an electronic device is provided. The electronic device comprises a transparent substrate, pixel structures and a first trace structure. The transparent substrate comprises a transparent region and a trace region. Each of the pixel structures at least has a sub-pixel structure of first color and a sub-pixel structure of second color. The sub-pixel structure of first color has a light emitting element of first color. The sub-pixel structure of second color has a light emitting element of second color. The first trace structure comprises a first main trace, a first auxiliary trace and a second auxiliary trace. The first main trace is disposed in the trace region and surrounds at least a portion of the transparent region. The first auxiliary trace and the second auxiliary trace are electrically connected to the first main trace and are respectively electrically connected to a corresponding sub-pixel structure of first color and a corresponding sub-pixel structure of second color.

According to another aspect of the present disclosure, a transparent display including an electronic device is provided. The electronic device comprises a transparent substrate, pixel structures and a first trace structure. The transparent substrate comprises a transparent region and a trace region. Each of the pixel structures at least has a sub-pixel structure of first color and a sub-pixel structure of second color. The sub-pixel structure of first color has a light emitting element of first color. The sub-pixel structure of second color has a light emitting element of second color. The first trace structure comprises a first main trace, a first auxiliary trace, and a second auxiliary trace. The first main trace is disposed in the trace region and surrounds at least a portion of the transparent region. The first auxiliary trace and the second auxiliary trace are electrically connected to the first main trace and are respectively electrically connected to a corresponding sub-pixel structure of first color and a corresponding sub-pixel structure of second color.

The above and other aspects of the present disclosure will become better understood with regard to the following detailed description of the embodiment (s). The following description is made with reference to the accompanying drawings.

DETAILED DESCRIPTION

In the following detailed description, for purposes of explanation, various details are provided in the descriptions below in order to provide a thorough understanding of the embodiments of the present disclosure. However, it should be understood that one or more embodiments can be implemented without using the details. In other circumstances, generally known structures and elements are schematically represented to simplify the drawings.

The ordinal numbers, such as "the first", "the second", and "the third", are used in the specification and the claims for modifying claim elements only, neither implying nor indicating that the claim elements have any previous ordinal numbers. The ordinal numbers do not indicate the sequence between one claim element and another claim element or the sequence in the manufacturing method. The ordinal numbers are used for clearly differentiating two claim elements having the same designation.

Figure 1:
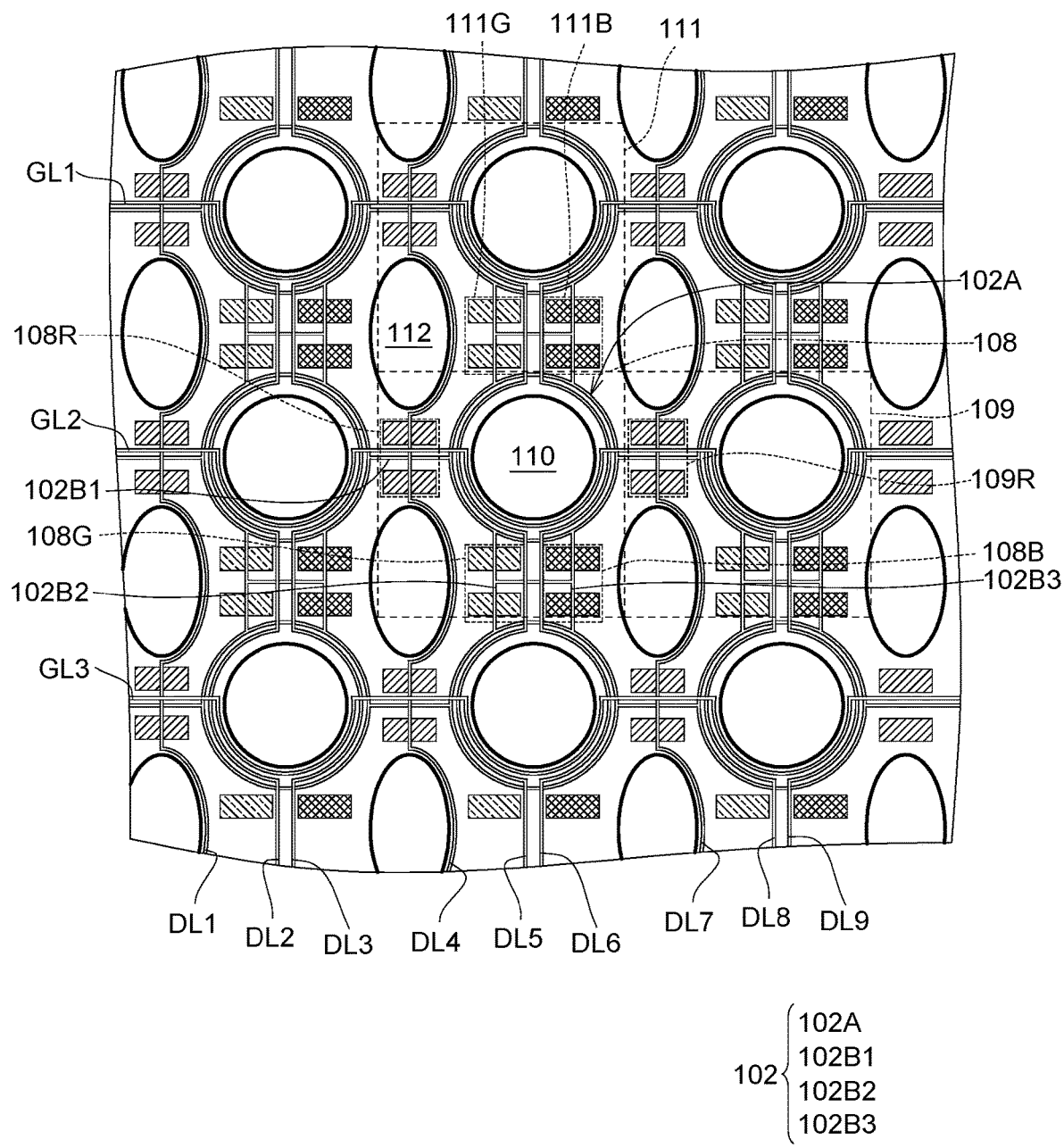
FIG. 1 is a schematic diagram of an electronic device according to an embodiment of the present disclosure.

FIG. 1 is a schematic diagram of an electronic device 10 according to an embodiment of the present disclosure. As indicated in FIG. 1, the electronic device 10 may comprise a transparent substrate (not illustrated), at least one pixel structure (such as a pixel structure 108) and a first trace structure 102.

In an embodiment, the pixel structure 108 may have a sub-pixel structure 108R of first color, a sub-pixel structure 108G of second color and/or a sub-pixel structure 108B of third color. The sub-pixel structure 108R of first color has a light emitting element of first color, the sub-pixel structure 108G of second color has a light emitting element of second color, and the sub-pixel structure 108B of third color has a light emitting element of third color. In the present embodiment, the first color, the second color and the third color can be such as red, green and blue, but the present disclosure is not limited thereto. For instance, the light emitting element of first color, the light emitting element of second color and the light emitting element of third color can individually be a light-emitting diode (LED), a mini light-emitting diode (mini LED), an organic light-emitting diode (OLED) or a micro light-emitting diode (micro LED). As indicated in FIG. 1, the sub-pixel structure 108R of first color, the sub-pixel structure 108G of second color and the sub-pixel structure 108B of third color can individually have two light emitting elements. In an embodiment, each of the sub-pixel structures emits light using one of the two light emitting elements. When said one of the two light emitting elements cannot function normally, the other light emitting element can replace said one of the two light emitting elements. In another embodiment, each of the sub-pixel structures can also have only one light emitting element.

In an embodiment, the sub-pixel structure 108R of first color, the sub-pixel structure 108G of second color and the sub-pixel structure 108B of third color can have an identical size or different sizes. The sub-pixel structure 108R of first color, the sub-pixel structure 108G of second color and the sub-pixel structure 108B of third color can have an identical shape or different shapes.

In an embodiment, the transparent substrate comprises several transparent regions (such as several transparent regions 110 and several transparent regions 112) and a trace region. The trace region described herein, in which the traces can be disposed, refers to the region outside the transparent regions of the electronic device 10, such as a region between two transparent regions 110, a region between two transparent regions 112 and a region between the transparent region 110 and the transparent region 112. The trace region may comprise other semi-transparent or non-transparent elements in the trace region, such as capacitors, traces or thin-film transistors. In the present embodiment, the transparent region 110 is a circular region, and the transparent region 112 is an elliptical region, but the present disclosure is not limited thereto. The transparent regions 110 and 112 can both be a circular region or an elliptical region. Alternatively, the transparent region 110 can be one of a circular region and an elliptical region, and the transparent region 112 can be the other one of a circular region and an elliptical region. In another embodiment, the transparent region 110 or the transparent region 112 can be a near-circular polygonal region.

In an embodiment, the first trace structure 102 may comprise a first main trace 102A, a first auxiliary trace 102B1, a second auxiliary trace 102B2 and/or a third auxiliary trace 102B3. The first main trace 102A is disposed in the trace region and surrounds at least a portion of the transparent region 110. FIG. 1 is exemplified by an example that the first main trace 102A surrounds the entire transparent region 110. The first main trace 102A corresponds to a shape of the transparent region 110 and is extended as a circle or an ellipse. The first auxiliary trace 102B1, the second auxiliary trace 102B2 and the third auxiliary trace 102B3 are electrically connected to the first main trace 102A and are respectively electrically connected to the sub-pixel structure 108R of first color, the sub-pixel structure 108G of second color and the sub-pixel structure 108B of third color.

In an embodiment, the first main trace 102A has an annular structure, and the first auxiliary trace 102B1, the second auxiliary trace 102B2 and the third auxiliary trace 102B3 may have a segment structure. The first auxiliary trace 102B1 and the second auxiliary trace 102B2 are located on different sides of the annular structure of the first main trace 102A, and the first auxiliary trace 102B1 and the third auxiliary trace 102B3 are located on different sides of the annular structure of the first main trace 102A. For instance, the first auxiliary trace 102B1 is located on the left side of the annular structure of the first main trace 102A, and the second auxiliary trace 102B2 and the third auxiliary trace 102B3 may be located on the lower side of the annular structure of the first main trace 102A. A material of the first trace structure 102 can comprise a conductive metal such as copper, but the present disclosure is not limited thereto.

In an embodiment, the second auxiliary trace 102B2 is substantially parallel to the third auxiliary trace 102B3, and the second auxiliary trace 102B2 can selectively be electrically connected to the third auxiliary trace 102B3 via another trace segment.

In an embodiment, the first main trace 102A can provide a voltage or a signal to at least two sub-pixel structures. In the present embodiment, the first main trace 102A can provide a voltage or a signal to six sub-pixel structures, but the present disclosure is not limited thereto. For instance, the first main trace 102A located in the pixel structure 108 can provide a voltage or a signal to six sub-pixel structures. The six sub-pixel structures comprise such as the sub-pixel structure 108R of first color of the pixel structure 108, the sub-pixel structure 108G of second color of the pixel structure 108, the sub-pixel structure 108B of third color of the pixel structure 108, the sub-pixel structure 109R of first color of the pixel structure 109, the sub-pixel structure 111G of second color of the pixel structure 111, and the sub-pixel structure 111B of third color of the pixel structure 111, wherein the pixel structure 109 is located on the right side of the pixel structure 108, and the pixel structure 111 is located on the upper side of the pixel structure 108.

As indicated in FIG. 1, the electronic device 10 may further comprise a data line trace structure and a gate line trace structure. In an embodiment, the data line trace structure may comprise data lines DL1-DL9, and the gate line trace structure may comprise gate lines GL1-GL3. The data line trace structure is disposed in the trace region and surrounds at least a portion of the transparent regions 110 and 112. The gate line trace structure is disposed in the trace region and surrounds at least a portion of the transparent region 110. The data line trace structure is extended along a first direction (such as the vertical direction), and the gate line trace structure is extended along a second direction (such as the horizontal direction), wherein the first direction and the second direction may be substantially perpendicular to each other. The data line trace structure has at least one semi-annular structure and at least one segment structure, and the semi-annular structure of the data line trace structure extends along the boundary of the transparent regions 110 and 112. The gate line trace structure has at least one semi-annular structure and at least one segment structure, and the semi-annular structure of the gate line trace structure extends along the boundary of the transparent region 110.

For briefly and clearly expressed, FIG. 1 illustrates one layer of trace structure. In actual application, the electronic device 10 may comprise more than two layers of trace structure.

Figure 2:
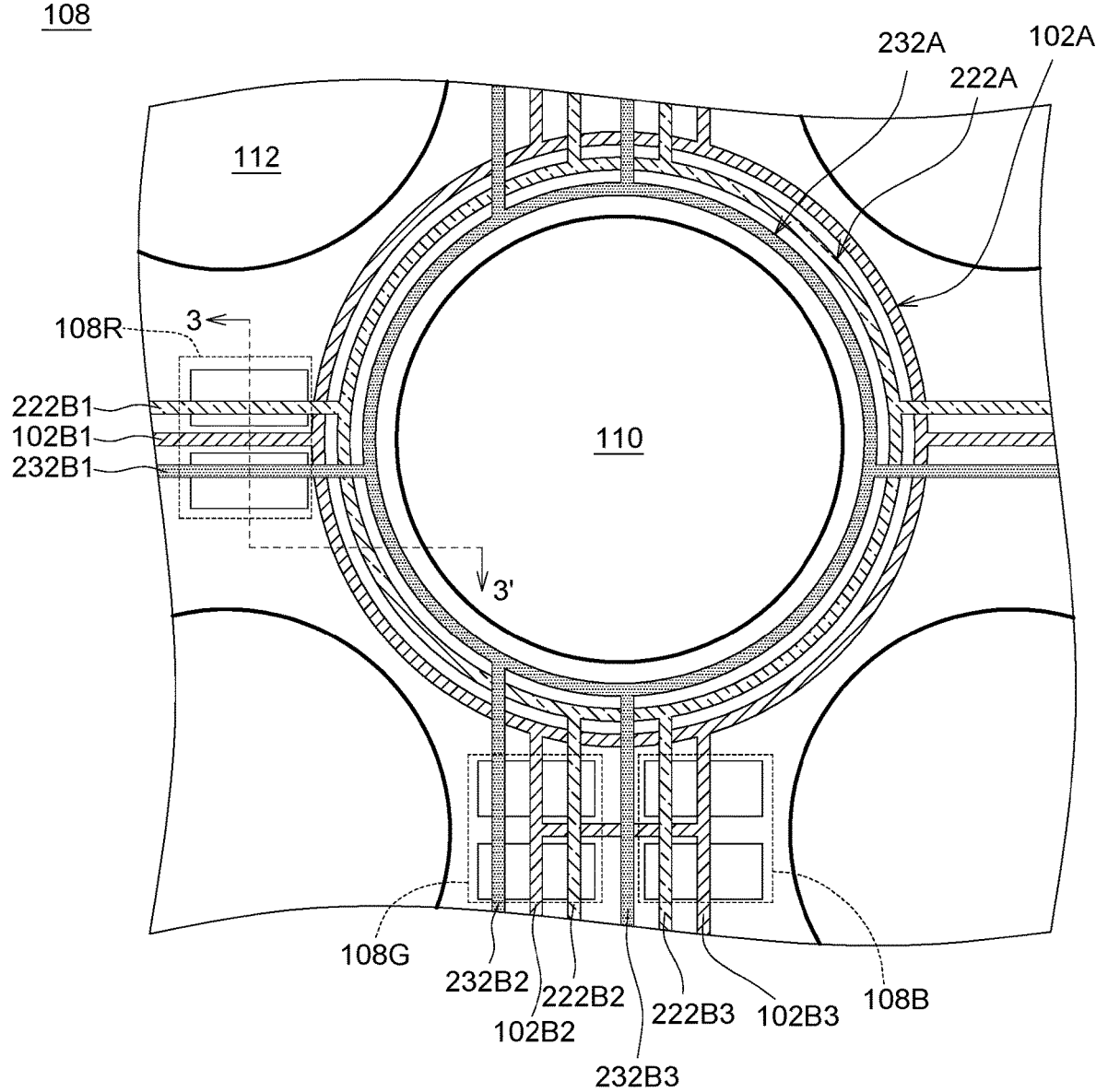
FIG. 2 is an enlarged schematic diagram of a pixel structure of FIG. 1.

FIG. 2 is an enlarged schematic diagram of a pixel structure 108 of FIG. 1. FIG. 2 is exemplified by an example that the electronic device 10 comprises three layers of trace structure. As indicated in FIG. 2, the electronic device 10 may further comprise a second trace structure 222 and a third trace structure 232 in addition to the first trace structure 102. The second trace structure 222 comprises a first main trace 222A, a first auxiliary trace 222B1, a second auxiliary trace 222B2 and/or a third auxiliary trace 222B3. The first main trace 222A is disposed in the trace region and surrounds at least a portion of the transparent region 110. The first main trace 222A corresponds to a shape of the transparent region 110 and is extended as a circle or an ellipse. The first auxiliary trace 222B1, the second auxiliary trace 222B2 and the third auxiliary trace 222B3 are electrically connected to the first main trace 222A and are respectively electrically connected to the sub-pixel structure 108R of first color, the sub-pixel structure 108G of second color and the sub-pixel structure 1086 of third color.

The third trace structure 232 comprises a first main trace 232A, a first auxiliary trace 232B1, a second auxiliary trace 23262 and/or a third auxiliary trace 232B3. The first main trace 232A is disposed in the trace region and surrounds at least a portion of the transparent region 110. The first main trace 232A corresponds to a shape of the transparent region 110 and is extended as a circle or an ellipse. The first auxiliary trace 232B1, the second auxiliary trace 232B2 and the third auxiliary trace 232B3 are electrically connected to the first main trace 232A and are respectively electrically connected to the sub-pixel structure 108R of first color, the sub-pixel structure 108G of second color and the sub-pixel structure 1086 of third color.

A projection of the first main trace 102A of the first trace structure 102, a projection of the first main trace 222A of the second trace structure 222 and a projection of the first main trace 232A of the third trace structure 232 are not overlapped. In another embodiment, at least two of the projection of the first main trace 102A of the first trace structure 102, the projection of the first main trace 222A of the second trace structure 222 and the projection of the first main trace 232A of the third trace structure 232 are partly overlapped. In an alternate embodiment, the projection of the first main trace 102A of the first trace structure 102, the projection of the first main trace 222A of the second trace structure 222 and the projection of the first main trace 232A of the third trace structure 232 are overlapped with each other.

The first trace structure 102, the second trace structure 222 and the third trace structure 232 can individually be one of a high potential power line trace structure, a low potential power line trace structure and a compensation setting trace structure, wherein the high potential power line trace structure is used to transfer a high potential voltage (VDD), the low potential power line trace structure is used to transfer a low potential voltage (VSS), and the compensation setting trace structure is used to transfer a compensation setting voltage (VINT). For instance, the compensation setting voltage (VINT) is used to adjust the threshold voltage (Vth) of the transistor in the pixel structure. In the present embodiment, the first trace structure 102 can be such as a high potential power line trace structure, the second trace structure 222 can be such as a low potential power line trace structure, and the third trace structure 232 can be such as a compensation setting trace structure, but the present disclosure is not limited thereto.

Figure 3:
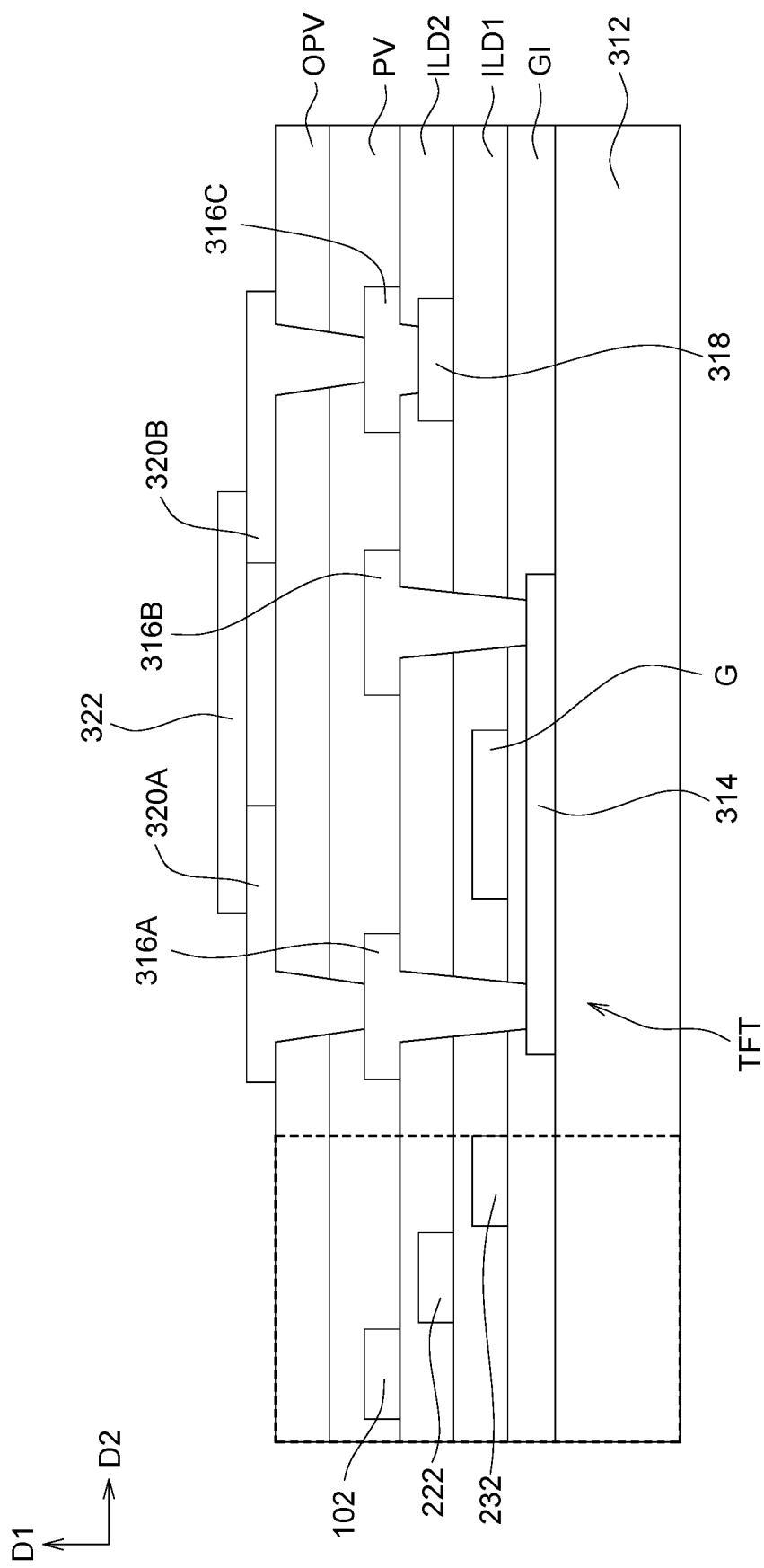
FIG. 3 is a cross-sectional schematic view along the tangent line 3-3' of FIG. 2.

FIG. 3 is referred, which illustrates a cross-sectional schematic view along the tangent line 3-3' of FIG. 2. For clearly expressed, FIG. 3 illustrates one light emitting element. The electronic device 10' may further comprise a transparent substrate 312, an insulation layer GI, a first interlayer dielectric layer ILD1, a second interlayer dielectric layer ILD2 and a protection layer (may comprise a protection layer PV and an organic protection layer OPV).

The insulation layer GI can cover on the transparent substrate 312, the first interlayer dielectric layer ILD1 can cover on the insulation layer GI, the second interlayer dielectric layer ILD2 can cover on the first interlayer dielectric layer ILD1, the protection layer PV can cover on the second interlayer dielectric layer ILD2, and the organic protection layer OPV can cover on the protection layer PV. The stacking relationship between the previous-mentioned elements can be changed. The embodiment of FIG. 3 is for explanatory purpose only, not for limiting the present disclosure.

The first trace structure 102 can such as be covered by the protection layer PV, the second trace structure 222 can such as be covered by the second interlayer dielectric layer ILD2, and the third trace structure 232 can such as be covered by the first interlayer dielectric layer ILD1.

As indicated in FIG. 3, the electronic device 10 may further comprise a polysilicon layer 314, a conductive layer 316A, a conductive layer 316B, a conductive layer 316C, a first metal layer 318, a first contact electrode 320A, a second contact electrode 320B and a transistor TFT.

The polysilicon layer 314 is covered by the insulation layer GI, the gate G is covered by the first interlayer dielectric layer ILD1, and the first metal layer 318 is covered by the second interlayer dielectric layer ILD2.

The conductive layer 316A extends and passes through the second interlayer dielectric layer ILD2, the first interlayer dielectric layer ILD1 and the insulation layer GI so as to be electrically connected to the polysilicon layer 314. The conductive layer 316B extends and passes through the second interlayer dielectric layer ILD2, the first interlayer dielectric layer ILD1 and the insulation layer GI so as to be electrically connected to the polysilicon layer 314. The conductive layer 316C extends and passes through the second interlayer dielectric layer ILD2 so as to be electrically connected to the first metal layer 318. For instance, the conductive layer 316A is used as one of a drain and a source of the transistor TFT, and the conductive layer 3166 is used as the other one of a drain and a source of the transistor TFT.

In an embodiment, the first contact electrode 320A is disposed on the organic protection layer OPV and is electrically connected to a light emitting element 322. The light emitting element 322 can be an OLED or a micro LED. The transistor TFT is electrically connected to the first trace structure 102, the second trace structure 222 or the third trace structure 232, and the transistor TFT is electrically connected to the first contact electrode 320A.

In an embodiment, the first contact electrode 320A extends and passes through the organic protection layer OPV and the protection layer PV so as to be electrically connected to the conductive layer 316A. The second contact electrode 320B extends and passes through the organic protection layer OPV and the protection layer PV so as to be electrically connected to the conductive layer 316C.

In an embodiment, first metal layer 318 and the conductive layer 316C can be used as such as a storage capacitor, the first contact electrode 320A can be electrically connected to an anode of an LED, and the second contact electrode 320B can be electrically connected to a cathode of the LED.

Figure 4:
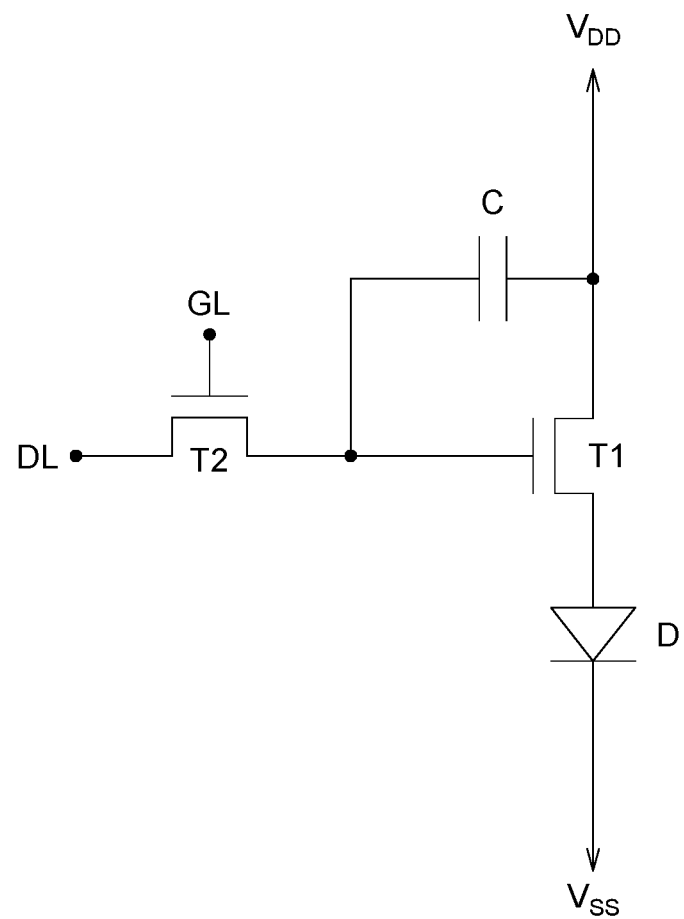
FIG. 4 is an example of a circuit corresponding to each of the sub-pixel structures corresponding to the above embodiments.

FIG. 4 is an example of a circuit 40 corresponding to each of the sub-pixel structures corresponding to the above embodiments.

In an embodiment, a pixel structure of the present disclosure can correspond to a circuit of two transistors and one storage capacitor (2T1C), but the present disclosure is not limited thereto. In some other embodiments, a pixel structure can correspond to a circuit of more than two transistors and at least one storage capacitor, or a circuit of other suitable number of transistors and storage capacitors.

The circuit 40 controls the electric current flowing through the light-emitting diode D using two transistors T1 and T2. The transistor T1 is coupled to the transistor T2, the storage capacitor C and the light-emitting diode D. The transistor T2 is coupled to the storage capacitor C, the gate line GL and the data line DL. The voltage transferred by the gate line GL determines whether the transistor T2 is turned on, the voltage transferred by the data line DL determines the magnitude of the electric current flowing through the transistor T1 and the light-emitting diode D, and the light intensity of the light-emitting diode D is relevant with the electric current flowing through the light-emitting diode D. The circuits of other number of transistors and storage capacitors can further receive a compensation setting voltage (VINT) to compensate or adjust the threshold voltage of a particular transistor, so as to further adjust the electric current flowing through the light-emitting diode D and change the light intensity of the light-emitting diode D.

Figure 5:
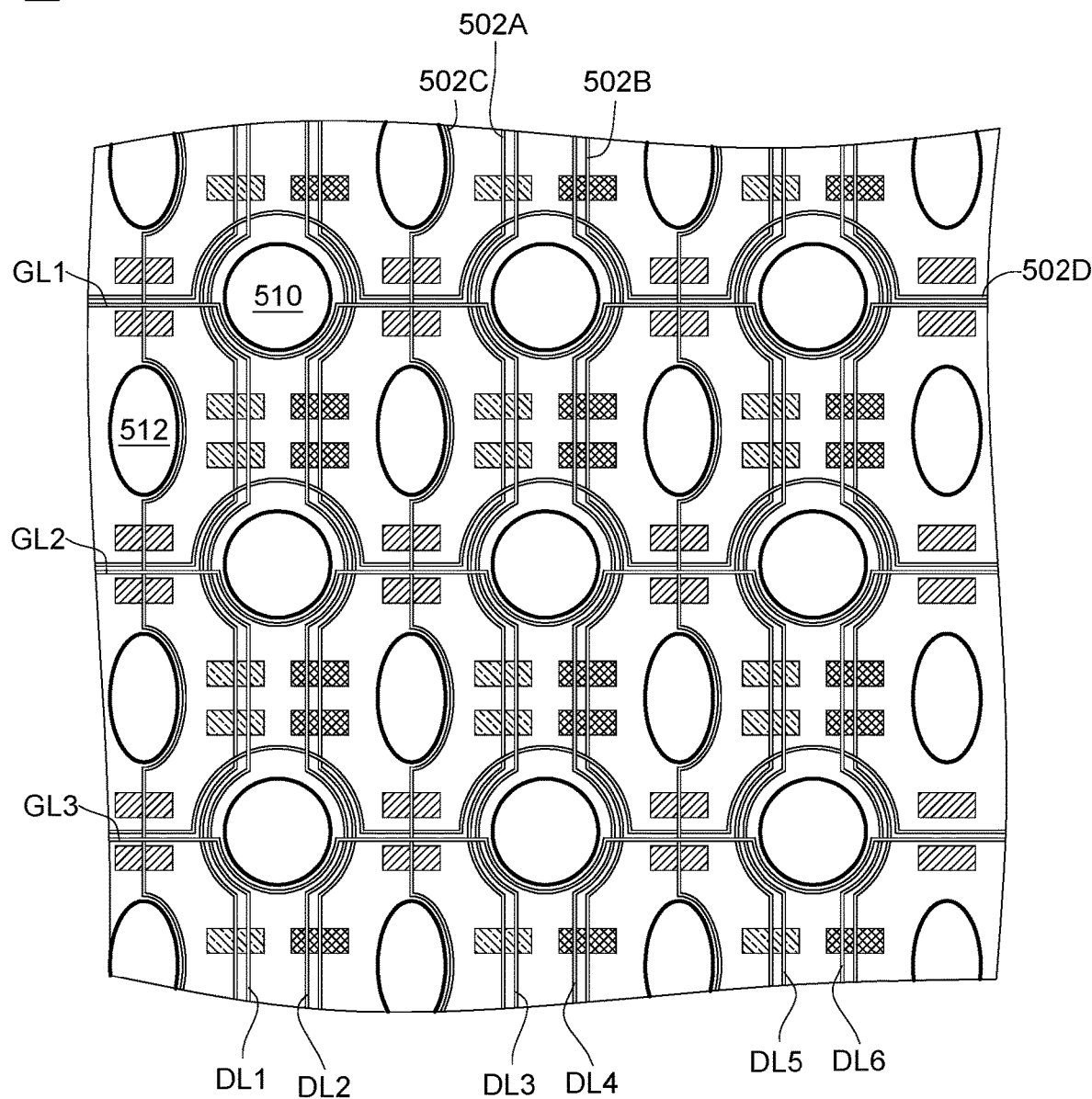
FIG. 5 is a schematic diagram of another electronic device.

FIG. 5 is a schematic diagram of another electronic device 50. The electronic device 50 of the present embodiment is different from the electronic device 10 of the first embodiment mainly in that, the electronic device 50 may have four trace structures, including a first trace structure 502A, a second trace structure 502B, a third trace structure 502C and a fourth trace structure 502D. The first trace structure 502A, the second trace structure 502B and the fourth trace structure 502D are disposed in the trace region and surround at least a portion of the transparent region 510. The third trace structure 502C is disposed in the trace region and surrounds at least a portion of the transparent region 512. The first trace structure 502A is used to provide the sub-pixel structure of the same column (such as green sub-pixel structure) with a required voltage, the second trace structure 502B is used to provide the sub-pixel structure of the same column (such as the blue sub-pixel structure) with a required voltage, the third trace structure 502C is used to provide the sub-pixel structure of the same column (such as the red sub-pixel structure) with a required voltage, and the fourth trace structure 502D is used to provide the red sub-pixel structure, the green sub-pixel structure, or the blue sub-pixel structure of the same row with a required voltage.

A comparison between the transparent display having the electronic device 10 of FIG. 1 and the transparent display having the electronic device 50 of FIG. 5 shows that, in the electronic device 50 of FIG. 5, the pixel structure of one color in a column needs a trace structure. In the electronic device 10 of FIG. 1, the high potential power line trace structure, the low potential power line trace structure or the compensation setting trace structure adopts the annular structure and the segment structure as shown in FIG. 1. (As indicated in FIG. 1, the first main trace 102A is circular or elliptical, and the first auxiliary trace 102B1 and the second auxiliary trace 102B2 have a segment structure, which allows one main trace of one trace structure to be electrically connected to several sub-pixel structures of different colors.) In this way, the required number of trace structures can be reduced, and the aperture ratio can be increased by such as 14%.

That is, a comparison between the transparent display of FIG. 1 and FIG. 2 and the transparent display of FIG. 5 shows that in the transparent display of FIG. 1 and FIG. 2, the trace structure has the main trace of the annular structure and the auxiliary trace of the segment structure, such that one trace structure can be electrically connected to several sub-pixel structures so as to provide the sub-pixel structures with a required power voltage or a compensation setting voltage. In this way, the number and the area of traces can be reduced, the aperture ratio can be further increased, and the transparency of the transparent display can be enhanced so as to improve the quality of the transparent display.

Figure 6:
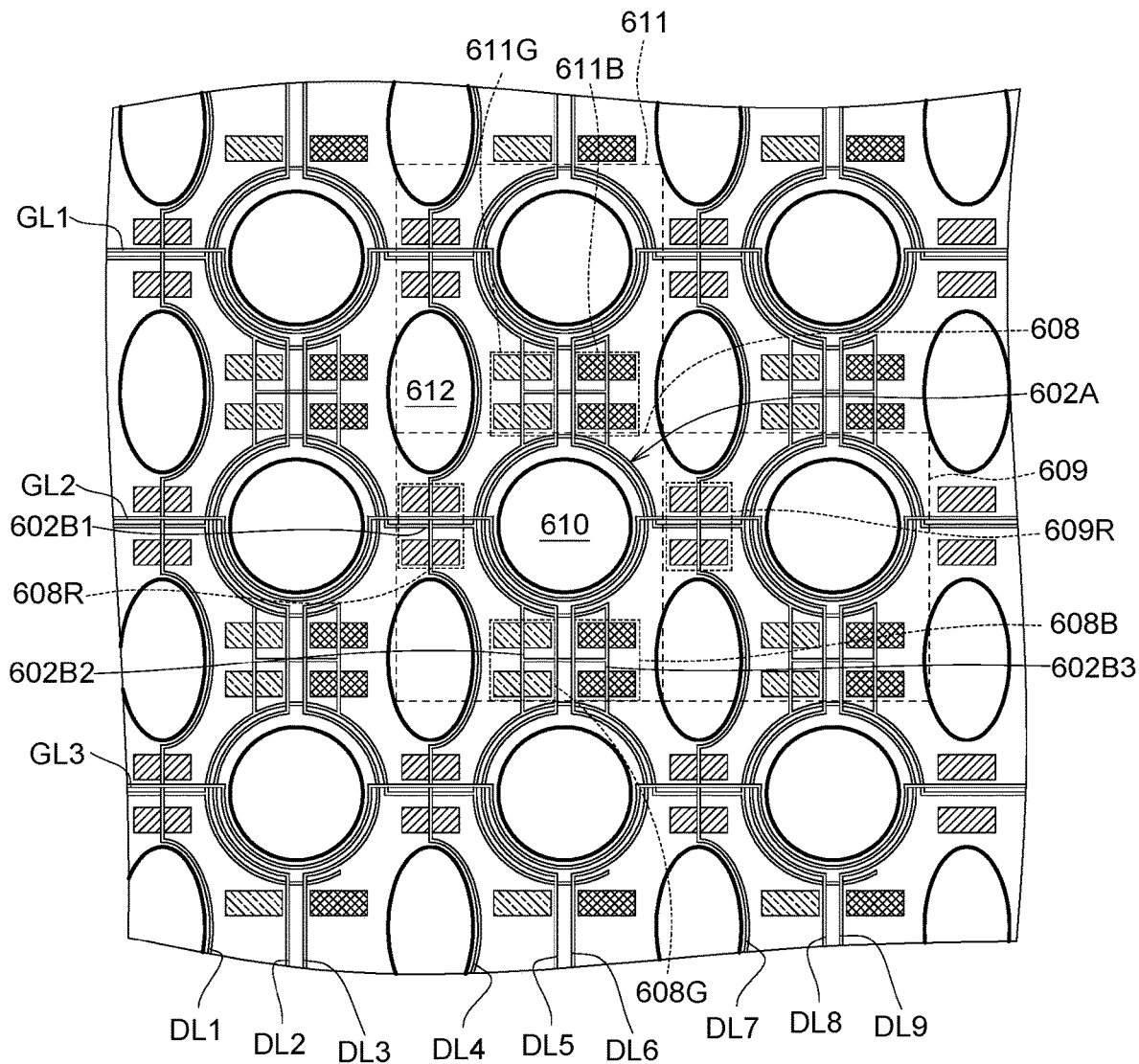
FIG. 6 is a schematic diagram of an electronic device according to another embodiment of the present disclosure.

FIG. 6 is a schematic diagram of an electronic device 60 according to another embodiment of the present disclosure. The elements in the present embodiment sharing the same or similar labels with those in the previous embodiment are the same or similar elements, and the description of which is omitted.

As indicated in FIG. 6, the first main trace 602A of the first trace structure 602 of the electronic device 60 of the present embodiment is a circle or an ellipse with an opening.

As indicated in FIG. 6, the electronic device 60 may comprise a transparent substrate (not illustrated), at least one pixel structure (such as a pixel structure 608) and a first trace structure 602.

The transparent substrate comprises transparent region 610, transparent region 612 and a trace region. The pixel structure 608 may have at least a sub-pixel structure 608R of first color, a sub-pixel structure 608G of second color and/or a sub-pixel structure 608B of third color. The first trace structure 602 comprises a first main trace 602A, a first auxiliary trace 602B1, a second auxiliary trace 602B2 and/or a third auxiliary trace 602B3. The first main trace 602A is disposed in the trace region and surrounds at least a portion of the transparent region 610. The first main trace 602A extends corresponding to a shape of the transparent region 610. The first auxiliary trace 602B1, the second auxiliary trace 602B2 and the third auxiliary trace 602B3 are electrically connected to the first main trace 602A and are respectively electrically connected to the sub-pixel structure 608R of first color, the sub-pixel structure 608G of second color and the sub-pixel structure 608B of third color.

In an embodiment, the first main trace 602A has a partial annular structure, and the first auxiliary trace 602B1, the second auxiliary trace 602B2 and the third auxiliary trace 602B3 may have a segment structure. The first auxiliary trace 602B1 and the second auxiliary trace 602B2 are located on different sides of the partial annular structure of the first main trace 602A, and the first auxiliary trace 602B1 and the third auxiliary trace 602B3 are located on different sides of the partial annular structure of the first main trace 602A.

In an embodiment, the first main trace 602A can provide a voltage or a signal to at least two sub-pixel structures. In the present embodiment, the first main trace 602A can provide a voltage or a signal to six sub-pixel structures, but the present disclosure is not limited thereto. For instance, the first main trace 602A located in the pixel structure 608 can provide a voltage or a signal to six sub-pixel structures. The six sub-pixel structures comprise such as the sub-pixel structure 608R of first color of the pixel structure 608, the sub-pixel structure 608G of second color of the pixel structure 608, the sub-pixel structure 608B of third color of the pixel structure 608, the sub-pixel structure 609R of first color of the pixel structure 609, the sub-pixel structure 611G of second color of the pixel structure 611, and the sub-pixel structure 611B of third color of the pixel structure 611, wherein the pixel structure 609 is located on the right side of the pixel structure 608, and the pixel structure 611 is located on the upper side of the pixel structure 608.

In an embodiment, the electronic device 60 may further comprise a data line trace structure and a gate line trace structure.

As indicated in FIG. 6, the electronic device 60 may further comprise a data line trace structure and a gate line trace structure. In an embodiment, the data line trace structure may comprise data lines DL1-DL9, and the gate line trace structure may comprise gate lines GL1-GL3. The data line trace structure is disposed in the trace region and surrounds at least a portion of the transparent regions 610 and 612, and the gate line trace structure is disposed in the trace region and surrounds at least a portion of the transparent region 610. The data line trace structure extends along a first direction (such as the vertical direction), and the gate line trace structure extends along a second direction (such as the horizontal direction), and the first direction and the second direction may be substantially perpendicular to each other. The data line trace structure has at least one semi-annular structure and at least one segment structure, and the semi-annular structure of the data line trace structure extends along the boundary of the transparent regions 610 and 612. The gate line trace structure has at least one semi-annular structure and at least one segment structure, and the semi-annular structure of the gate line trace structure extends along the boundary of the transparent region 610.

In an embodiment, a position of the opening of the first main trace 602A may not be limited as long as the signal of the electronic device 60 can be normally transferred. For clearly expressed, the electronic device 60 of FIG. 6 only illustrates one layer of trace structure, but the electronic device 60 may have multi-layers of trace structure.

In comparison to the electronic device 50 of FIG. 5, one of the high potential power line trace structure, the low potential power line trace structure and the compensation setting trace structure adopts the partial annular structure of the present embodiment (that is, the first main trace 602A is a circle or an ellipse with an opening), and the aperture ratio can be increased by 6%. If two of the high potential power line trace structure, the low potential power line trace structure and the compensation setting trace structure adopt the partial annular structure of the present embodiment, the aperture ratio can be increased by 12.5%. If the high potential power line trace structure, the low potential power line trace structure and the compensation setting trace structure adopt the partial annular structure of the present embodiment, the aperture ratio can be increased by 19.4%.

Figure 7:
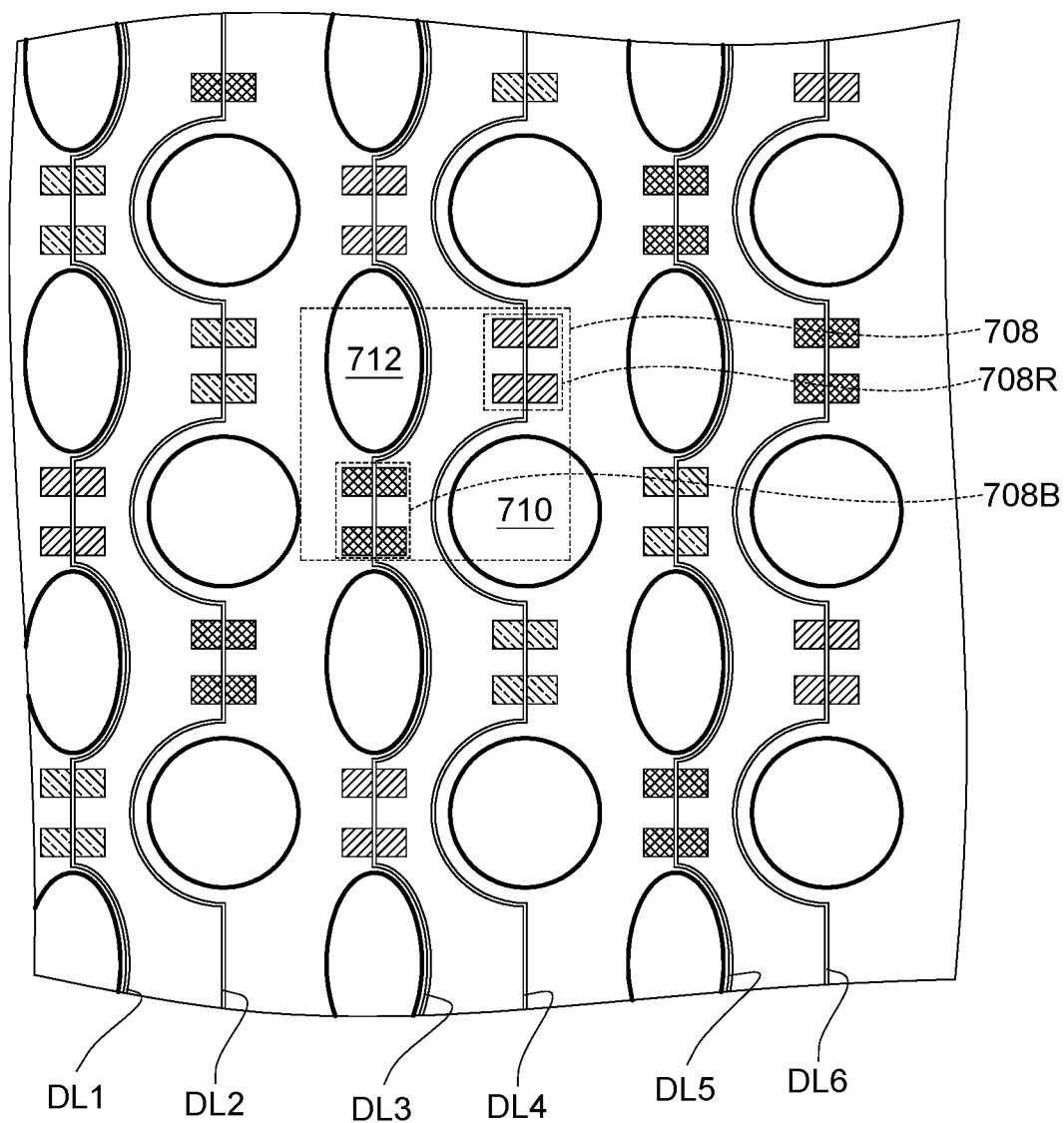
FIG. 7 is a schematic diagram of an electronic device according to an alternate embodiment of the present disclosure.

FIG. 7 is a schematic diagram of an electronic device 70 according to an alternate embodiment of the present disclosure. The elements in the present embodiment sharing the same or similar labels with those in the previous embodiment are the same or similar elements, and the description of which is omitted.

As indicated in FIG. 7, the electronic device 70 of the present embodiment adopts the sub-pixel rendering technology, such that one pixel structure 708 corresponds to two sub-pixels of different colors and two data lines (such as data lines DL3 and DL4).

The trace structure of the present embodiment can adopt the layout design of the first trace structure of the above embodiments. Relevant descriptions of the first trace structure can be obtained with reference to the above embodiments and are not repeated here.

In an embodiment, the pixel structure 708 has at least a sub-pixel structure 708R of first color and a sub-pixel structure 708B of third color. Relevant descriptions of the sub-pixel structure 708R of first color and the sub-pixel structure 708B of third color can be obtained with reference to the above embodiments and are not repeated here.

As indicated in FIG. 7, the electronic device 70 may further comprise a data line trace structure and a gate line trace structure (not illustrated).

In an embodiment, the data line trace structure comprises data lines DL1-DL6. The pixel structure 708 corresponds to two data lines DL3 and DL4. The data line trace structure is disposed in the trace region and surrounds at least a portion of the transparent regions 710 and 712. The data line trace structure has at least one semi-annular structure and at least one segment structure, and the semi-annular structure of the data line trace structure extends along the boundary of the transparent regions 710 and 712.

In comparison to the electronic device 50 of FIG. 5, by adopting the layout design of the electronic device of the present embodiment, the aperture ratio can be increased by 3.1%.

Figure 8:
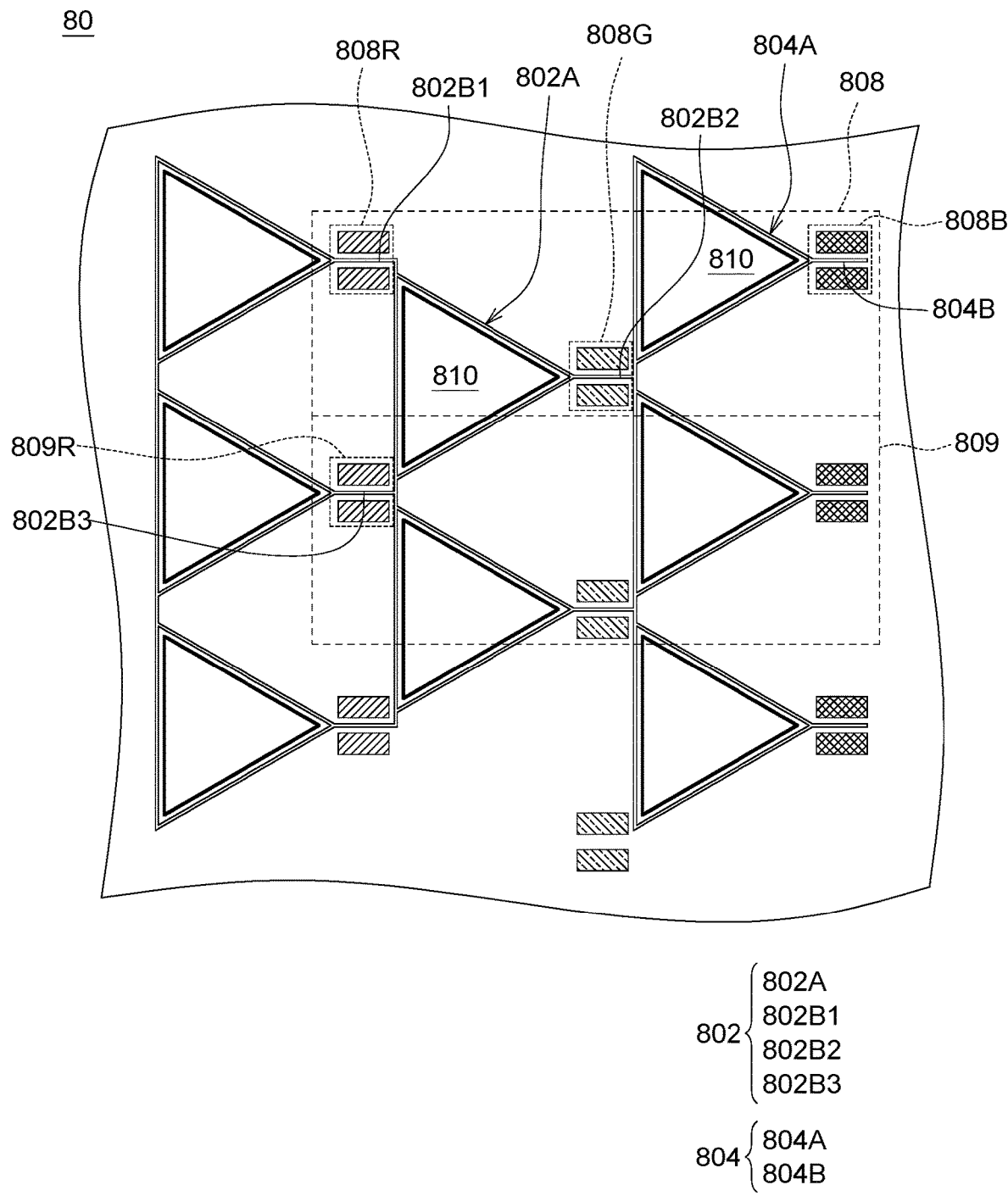
FIG. 8 is a schematic diagram of an electronic device according to another alternate embodiment of the present disclosure.

FIG. 8 is a schematic diagram of an electronic device 80 according to another alternate embodiment of the present disclosure. The elements in the present embodiment sharing the same or similar labels with those in the previous embodiment are the same or similar elements, and the description of which is omitted.

As indicated in FIG. 8, a shape of the first main trace 802A of the first trace structure 802 of the electronic device 80 of the present embodiment is a triangle.

As indicated in FIG. 8, the electronic device 80 may comprise a transparent substrate (not illustrated), at least one pixel structure (such as a pixel structure 808) and a first trace structure 802.

In an embodiment, the pixel structure 808 has at least a sub-pixel structure 808R of first color, a sub-pixel structure 808G of second color and/or a sub-pixel structure 808B of third color. Relevant descriptions of the sub-pixel structure 808R of first color, the sub-pixel structure 808G of second color and the sub-pixel structure 808B of third color can be obtained with reference to the embodiment as indicated in FIG. 1 and are not repeated here.

In an embodiment, the transparent substrate comprises a transparent region 810 and a trace region. The trace region described herein refers to the region outside the transparent region 810 of the electronic device 80. The trace region comprises other semi-transparent or non-transparent elements in the trace region, such as capacitors, traces or thin-film transistors. In the present embodiment, the transparent region 810 is a triangular region.

In an embodiment, the first trace structure 802 comprises a first main trace 802A, a first auxiliary trace 802B1, a second auxiliary trace 802B2 and a third auxiliary trace 802B3. The first main trace 802A is disposed in the trace region and surrounds at least a portion of the transparent region 810. The first main trace 802A corresponds to a shape of the transparent region 810 and is extended as a triangle. The first auxiliary trace 802B1, the second auxiliary trace 802B2 and the third auxiliary trace 802B3 are electrically connected to the first main trace 802A. The first auxiliary trace 802B1 is electrically connected to the sub-pixel structure 808R of first color. The second auxiliary trace 80262 is electrically connected to the sub-pixel structure 808G of second color. The third auxiliary trace 802B3 is electrically connected to the sub-pixel structure 809R of first color. In the present embodiment, the first color and the second color are such as red and green, but the present disclosure is not limited thereto.

In an embodiment, the first main trace 802A has an annular structure, and the first auxiliary trace 802B1, the second auxiliary trace 802B2 and the third auxiliary trace 802B3 may have a segment structure. The first auxiliary trace 802B1 and the second auxiliary trace 802B2 are located on different sides of the annular structure of the first main trace 802A, and the second auxiliary trace 802B2 and the third auxiliary trace 802B3 are located on different sides of the annular structure of the first main trace 802A. For instance, the first auxiliary trace 802B1 and the second auxiliary trace 802B2 are respectively located on the left and the right side of the annular structure of the first main trace 802A, and the third auxiliary trace 802B3 is located on the left side of the annular structure of the first main trace 802A.

In an embodiment, the first auxiliary trace 802B1 may be substantially parallel to the second auxiliary trace 802B2 and the third auxiliary trace 802B3.

In an embodiment, the first main trace 802A can provide a voltage or a signal to at least two sub-pixel structures. In the present embodiment, the first main trace 802A can provide a voltage or a signal to three sub-pixel structures, but the present disclosure is not limited thereto. For instance, the first main trace 802A located in the pixel structure 808 can provide a voltage or a signal to three sub-pixel structures. The three sub-pixel structures comprise such as the sub-pixel structure 808R of first color of the pixel structure 808, the sub-pixel structure 808G of second color of the pixel structure 808 and the sub-pixel structure 809R of first color of the pixel structure 809, wherein the pixel structure 808 is located on the upper side of the pixel structure 809.

As indicated in FIG. 8, the electronic device 80 may further comprise a second trace structure 804.

In an embodiment, the second trace structure 804 comprises a first main trace 804A and/or a first auxiliary trace 804B. The first main trace 804A is disposed in the trace region and surrounds at least a portion of the transparent region 810. The first main trace 804A corresponds to the shape of the transparent region 810 and is extended as a triangle. The first auxiliary trace 804B is electrically connected to the first main trace 804A and is electrically connected to sub-pixel structure 808B of third color of the pixel structure 808. In the present embodiment, the third color is such as blue, but the present disclosure is not limited thereto.

In an embodiment, the first main trace 804A has an annular structure, the first auxiliary trace 804B may have a segment structure. The first auxiliary trace 804B is located such as on the right side of the annular structure of the first main trace 804A.

The electronic device 80 may further comprise a data line trace structure (not illustrated) and a gate line trace structure (not illustrated).

In an embodiment, the data line trace structure and the gate line trace structure are disposed in the trace region and surround at least a portion of the transparent region 810. The data line trace structure extends along a first direction, and the gate line trace structure extends along a second direction, and the first direction and the second direction may be substantially perpendicular to each other. The data line trace structure and the gate line trace structure extend along a boundary of the transparent region 810.

For briefly and clearly expressed, FIG. 8 illustrates one layer of trace structure. In actual application, the electronic device 80 may comprise more than two layers of trace structure.

Figure 9:
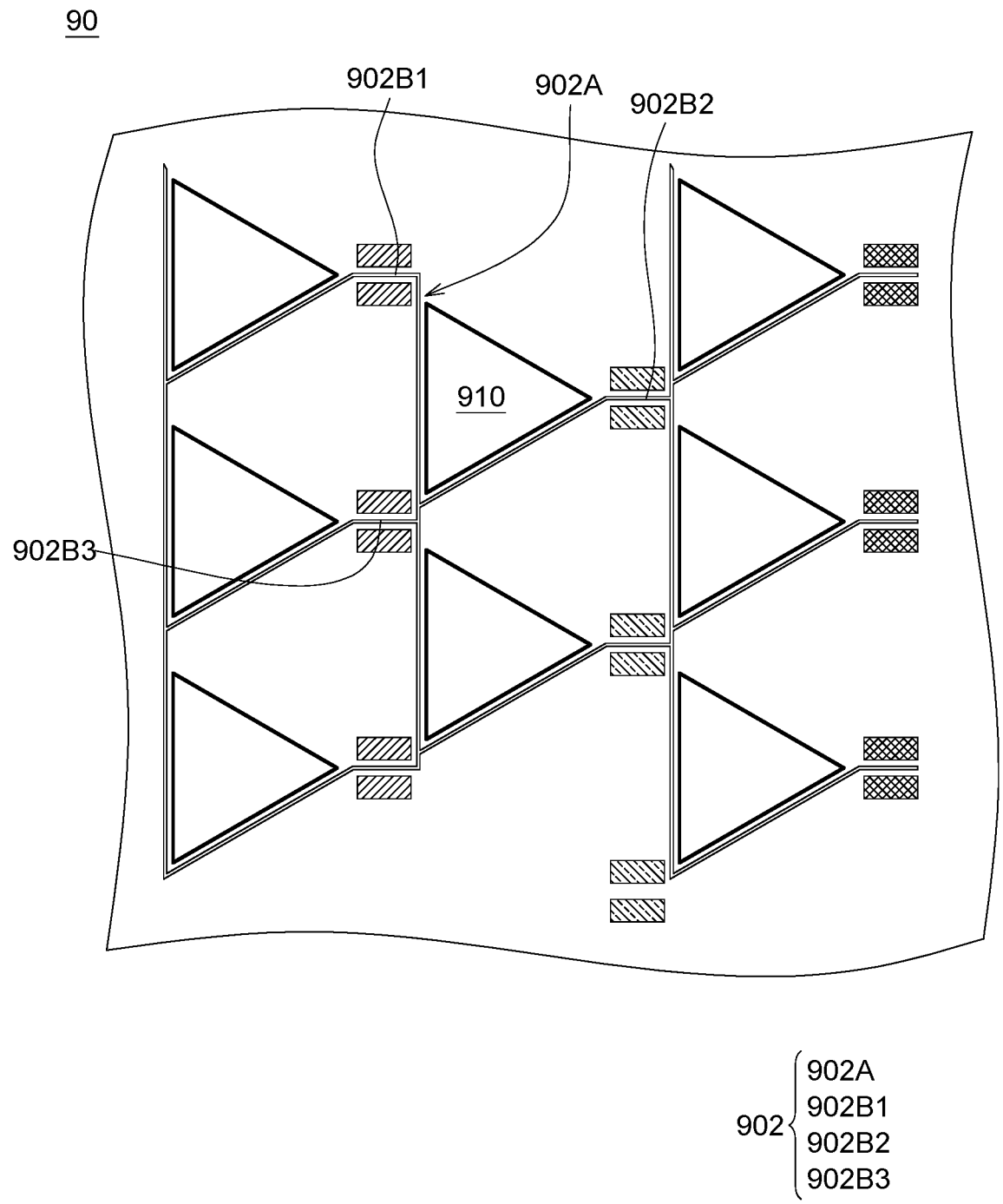
FIG. 9 is a schematic diagram of an electronic device according to an alternate embodiment of the present disclosure.

FIG. 9 is a schematic diagram of an electronic device 90 according to an alternate embodiment of the present disclosure. The elements in the present embodiment sharing the same or similar labels with those in the previous embodiment are the same or similar elements, and the description of which is omitted.

As indicated in FIG. 9, a first main trace 902A of a first trace structure 902 of the electronic device 90 of the present embodiment is a triangle with an opening.

In an embodiment, the first main trace 902A has a partial annular structure, and the first auxiliary trace 902B1, the second auxiliary trace 902B2 and the third auxiliary trace 902B3 may have a segment structure. The first auxiliary trace 902B1 and the second auxiliary trace 902B2 are located on different sides of the partial annular structure of the first main trace 902A, and the second auxiliary trace 902B2 and the third auxiliary trace 902B3 are located on different sides of the partial annular structure of the first main trace 902A. For example, the first auxiliary trace 902B1 and the second auxiliary trace 902B2 are respectively located on the left and right side of the partial annular structure of the first main trace 902A, and the third auxiliary trace 902B3 is located on the left side of the partial annular structure of the first main trace 902A.

In an embodiment, a position of the opening of the first main trace 902A may not be limited as long as the signal of the electronic device 90 can be normally transferred. As an example, the position of the opening is located at the top right of the triangle in the embodiment of FIG. 9. For clearly expressed, the electronic device 90 of FIG. 9 illustrates one layer of trace structure, but the electronic device 90 may also have multi-layers of trace structure.

Figure 10:
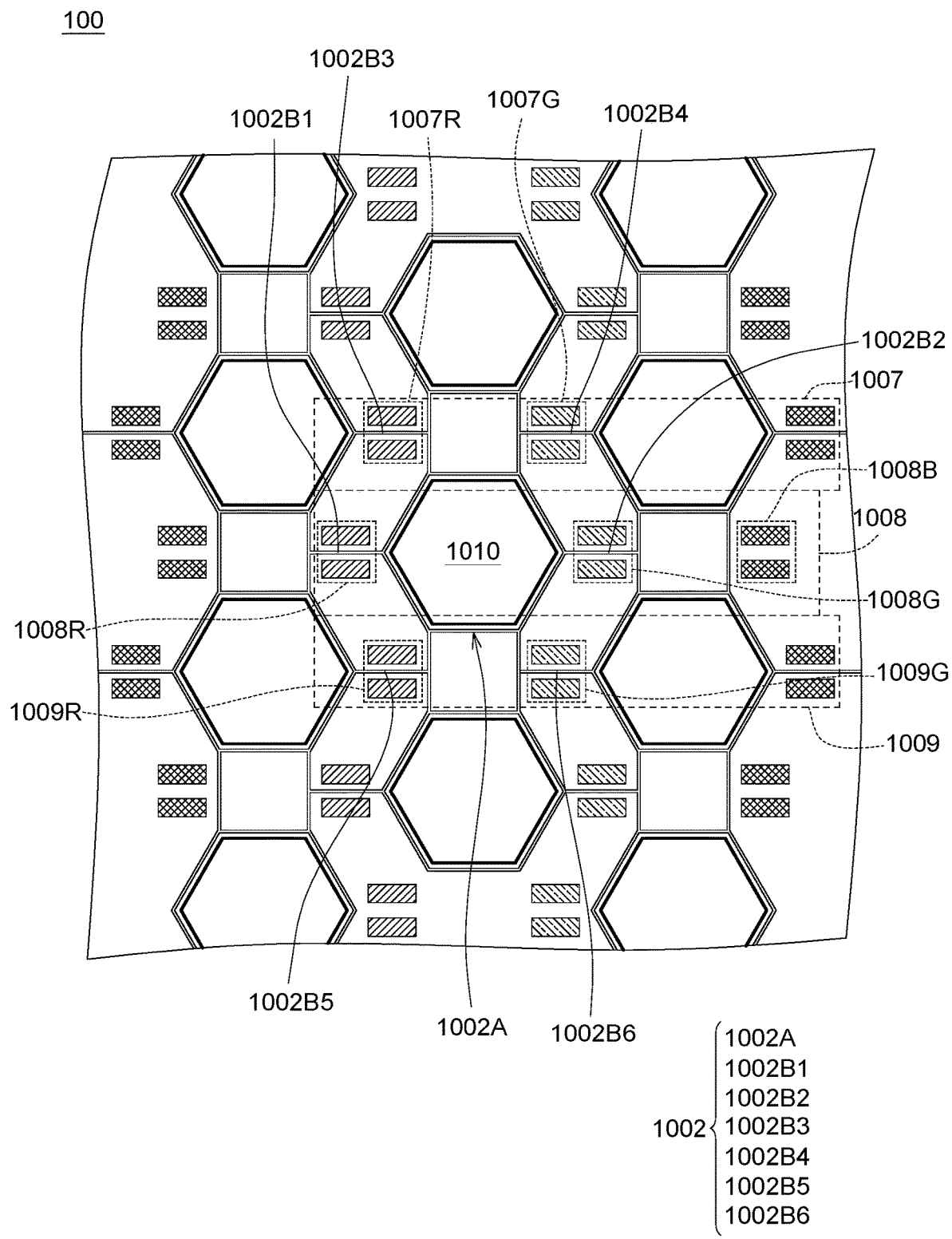
FIG. 10 is a schematic diagram of an electronic device according to another alternate embodiment of the present disclosure.

FIG. 10 is a schematic diagram of an electronic device 100 according to another alternate embodiment of the present disclosure. The elements in the present embodiment sharing the same or similar labels with those in the previous embodiment are the same or similar elements, and the description of which is omitted.

As indicated in FIG. 10, a shape of a first main trace 1002A of a first trace structure 1002 of the electronic device 100 of the present embodiment is a hexagon.

As indicated in FIG. 10, the electronic device 100 may comprise a transparent substrate (not illustrated), at least one pixel structure (such as a pixel structure 1008) and a first trace structure 1002.

In an embodiment, the pixel structure 1008 has at least a sub-pixel structure 1008R of first color, a sub-pixel structure 1008G of second color and/or a sub-pixel structure 1008B of third color. Relevant descriptions of the sub-pixel structure 1008R of first color, the sub-pixel structure 1008G of second color and the sub-pixel structure 1008B of third color can be obtained with reference to the embodiment as indicated in FIG. 1 and are not repeated here.

In an embodiment, the transparent substrate comprises a transparent region 1010 and a trace region. The trace region described herein refers to the region outside the transparent region 1010 of the electronic device 100. The trace region comprises other semi-transparent or non-transparent elements in the trace region, such as capacitors, traces or thin-film transistors. In the present embodiment, the transparent region 1010 is a hexagonal region.

In an embodiment, the first trace structure 1002 comprises a first main trace 1002A, a first auxiliary trace 1002B1, a second auxiliary trace 1002B2, a third auxiliary trace 1002B3, a fourth auxiliary trace 1002B4, a fifth auxiliary trace 1002B5 and a sixth auxiliary trace 1002B6. The first main trace 1002A is disposed in the trace region and surrounds at least a portion of the transparent region 1010. The first main trace 1002A corresponds to a shape of the transparent region 1010 and is extended as a hexagon. The first auxiliary trace 1002B1, the second auxiliary trace 1002B2, the third auxiliary trace 1002B3, the fourth auxiliary trace 1002B4, the fifth auxiliary trace 1002B5 and the sixth auxiliary trace 1002B6 are electrically connected to the first main trace 1002A. The first auxiliary trace 1002B1 is electrically connected to the sub-pixel structure 1008R of first color of the pixel structure 1008. The second auxiliary trace 1002B2 is electrically connected to the sub-pixel structure 1008G of second color of the pixel structure 1008. The third auxiliary trace 1002B3 is electrically connected to the sub-pixel structure 1007R of first color of the pixel structure 1007. The fourth auxiliary trace 1002B4 is electrically connected to the sub-pixel structure 1007G of second color of the pixel structure 1007. The fifth auxiliary trace 1002B5 is electrically connected to the sub-pixel structure 1009R of first color of the pixel structure 1009. The sixth auxiliary trace 1002B6 is electrically connected to the sub-pixel structure 1009G of second color of the pixel structure 1009. In the present embodiment, the first color and the second color are such as red and green, but the present disclosure is not limited thereto.

In an embodiment, the first main trace 1002A has an annular structure, and the first auxiliary trace 1002B1, the second auxiliary trace 1002B2, the third auxiliary trace 1002B3, the fourth auxiliary trace 1002B4, the fifth auxiliary trace 1002B5 and the sixth auxiliary trace 1002B6 may have a segment structure. The first auxiliary trace 1002B1, the third auxiliary trace 1002B3, the fifth auxiliary trace 1002B5 and the second auxiliary trace 1002B2, the fourth auxiliary trace 1002B4, the sixth auxiliary trace 1002B6 are located on different sides of the annular structure of the first main trace 1002A, such as on the left and right side of the annular structure of the first main trace 1002A.

In an embodiment, the first main trace 1002A can provide a voltage or a signal to at least two sub-pixel structures. In the present embodiment, the first main trace 1002A can provide a voltage or a signal to six sub-pixel structures, but the present disclosure is not limited thereto. For instance, the first main trace 1002A located in the pixel structure 1008 can provide a voltage or a signal to six sub-pixel structures. The six sub-pixel structures comprise such as the sub-pixel structure 1007R of first color of the pixel structure 1007, the sub-pixel structure 1007G of second color of the pixel structure 1007, the sub-pixel structure 1008R of first color of the pixel structure 1008, the sub-pixel structure 1008G of second color of the pixel structure 1008, the sub-pixel structure 1009R of first color of the pixel structure 1009 and the sub-pixel structure 1009G of second color of the pixel structure 1009, wherein the pixel structure 1007 is located on the upper side of the pixel structure 1008, and the pixel structure 1009 is located on the lower side of the pixel structure 1008.

The electronic device 100 may further comprise a data line trace structure (not illustrated) and a gate line trace structure (not illustrated).

In an embodiment, the data line trace structure and the gate line trace structure are disposed in the trace region and surround at least a portion of the transparent region 1010. The data line trace structure extends along a first direction, and the gate line trace structure extends along a second direction, and the first direction and the second direction may be substantially perpendicular to each other. The data line trace structure and the gate line trace structure extend along a boundary of the transparent region 1010. In another embodiment, the data line trace structure and the gate line trace structure individually have a semi-hexagonal structure and a segment structure and extend along the boundary of the transparent region 1010.

For briefly and clearly expressed, FIG. 10 illustrates one layer of trace structure. In actual application, the electronic device 100 may comprise more than two layers of trace structure.

Figure 11:
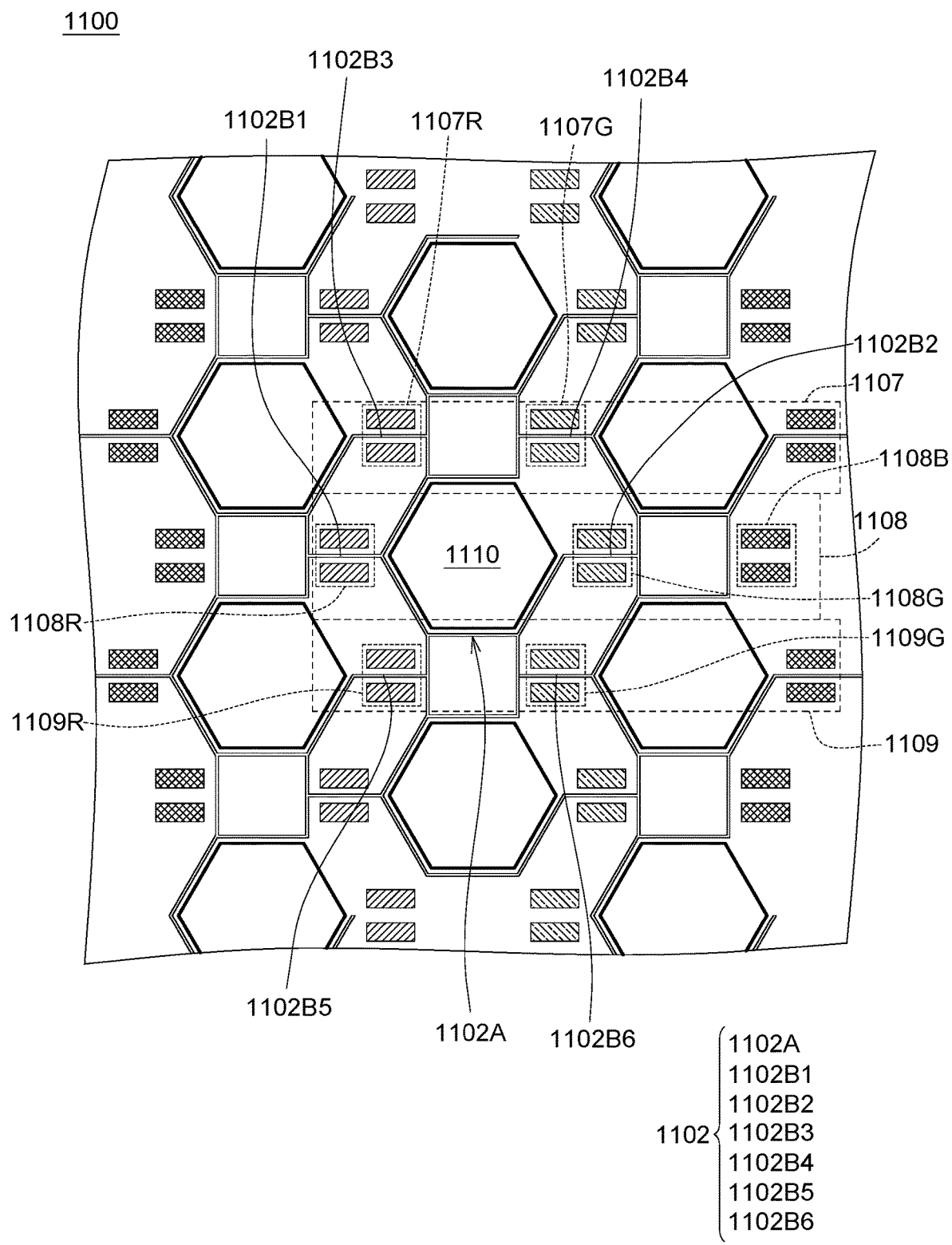
FIG. 11 is a schematic diagram of an electronic device according to an alternate embodiment of the present disclosure.

FIG. 11 is a schematic diagram of an electronic device 1100 according to an alternate embodiment of the present disclosure. The elements in the present embodiment sharing the same or similar labels with those in the previous embodiment are the same or similar elements, and the description of which is omitted.

As indicated in FIG. 11, a first main trace 1102A of a first trace structure 1102 of the electronic device 1100 of the present embodiment is a hexagon with an opening.

In an embodiment, the first main trace 1102A has a partial annular structure, and the first auxiliary trace 1102B1, the second auxiliary trace 1102B2, the third auxiliary trace 1102B3, the fourth auxiliary trace 1102B4, the fifth auxiliary trace 1102B5 and the sixth auxiliary trace 1102B6 may have a segment structure. The first auxiliary trace 1102B1, the third auxiliary trace 1102B3, the fifth auxiliary trace 1102B5 and the second auxiliary trace 1102B2, the fourth auxiliary trace 1102B4, the sixth auxiliary trace 1102B6 are located on different sides of the partial annular structure of the first main trace 1102A, such as on the left and right side of the partial annular structure of the first main trace 1102A.

In an embodiment, a position of the opening of the first main trace 1102A may not be limited as long as the signal of the electronic device 1100 can be normally transferred. As an example, the position of the opening is located at the top right of the hexagon in the present embodiment. For clearly expressed, the electronic device 1100 of FIG. 11 illustrates one layer of trace structure, but the electronic device 1100 may have multi-layers of trace structure.

Figure 12:
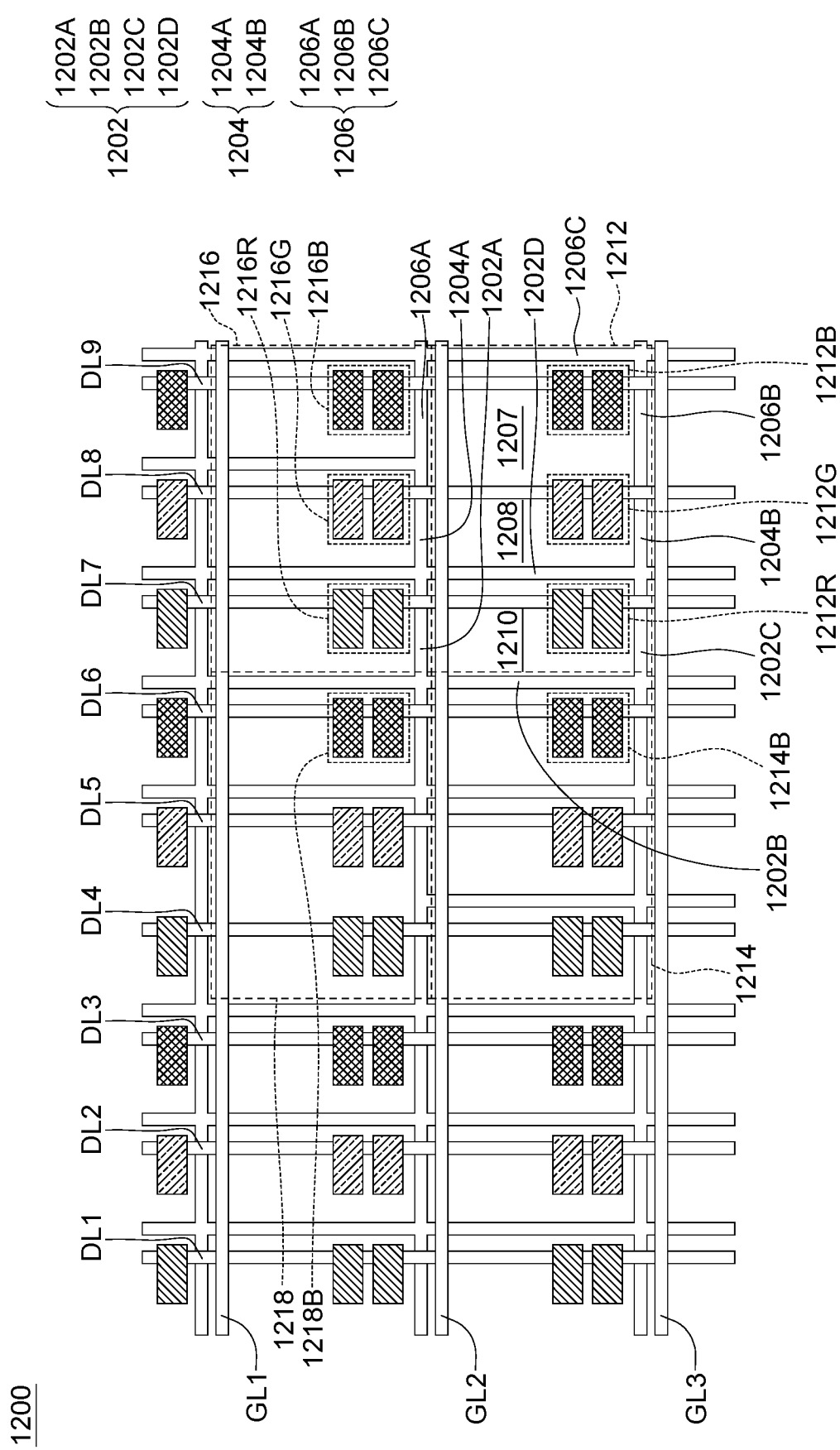
FIG. 12 is a schematic diagram of an electronic device according to another alternate embodiment of the present disclosure.

FIG. 12 is a schematic diagram of an electronic device 1200 according to another alternate embodiment of the present disclosure. The elements in the present embodiment sharing the same or similar labels with those in the previous embodiment are the same or similar elements, and the description of which is omitted.

As indicated in FIG. 12, a shape of a first trace structure 1202 of the electronic device 1200 of the present embodiment is a rectangle.

As indicated in FIG. 12, the electronic device 1200 may comprise a transparent substrate (not illustrated), at least one pixel structure (such as pixel structures 1212, 1214, 1216 or 1218) and a first trace structure 1202.

In an embodiment, the first trace structure 1202 can provide a voltage or a signal to at least two sub-pixel structures. In the present embodiment, the first trace structure 1202 can provide a voltage or a signal to four sub-pixel structures, but the present disclosure is not limited thereto. For instance, the first trace structure 1202 located in the pixel structure 1212 can provide a voltage or a signal to four sub-pixel structures. The four sub-pixel structures comprise such as the sub-pixel structure 1212R of first color of the pixel structure 1212, the sub-pixel structure 1214B of third color of the pixel structure 1214, the sub-pixel structure 1216R of first color of the pixel structure 1216, and the sub-pixel structure 1218B of third color of the pixel structure 1218, wherein the pixel structure 1214 is located on the left side of the pixel structure 1212, the pixel structure 1216 is located on the upper side of the pixel structure 1212, and the pixel structure 1218 is located on the left side of the pixel structure 1216.

In an embodiment, the transparent substrate comprises a transparent region 1207, 1208, 1210 and a trace region. The pixel structure 1212 may have a sub-pixel structure 1212R of first color, a sub-pixel structure 1212G of second color and/or a sub-pixel structure 1212B of third color. The first trace structure 1202 comprises a first main trace 1202A, a second main trace 1202B, a third main trace 1202C and/or a fourth main trace 1202D. The first main trace 1202A, the second main trace 1202B, the third main trace 1202C and the fourth main trace 1202D are disposed in the trace region and surround at least a portion of the transparent region 1210. The first main trace 1202A is electrically connected to the sub-pixel structure 1216R of first color of the pixel structure 1216 and the sub-pixel structure 1218B of third color of the pixel structure 1218. The second main trace 1202B is electrically connected to the sub-pixel structure 1214B of third color of the pixel structure 1214 and the sub-pixel structure 1218B of third color of the pixel structure 1218. The third main trace 1202C is electrically connected to the sub-pixel structure 1212R of first color of the pixel structure 1212 and the sub-pixel structure 1214B of third color of the pixel structure 1214. The fourth main trace 1202D is electrically connected to the sub-pixel structure 1212R of first color of the pixel structure 1212 and the sub-pixel structure 1216R of first color of the pixel structure 1216.

The electronic device 1200 may further comprise a second trace structure 1204 and/or a third trace structure 1206, wherein the second trace structure 1204 and the third trace structure 1206 are a rectangle with an opening.

In an embodiment, the second trace structure 1204 comprises a first main trace 1204A and/or a second main trace 1204B. The first main trace 1204A and the second main trace 1204B are disposed in the trace region and surround at least a portion of the transparent region 1208. The first main trace 1204A is electrically connected to the sub-pixel structure 1216R of first color of the pixel structure 1216 and the sub-pixel structure 1216G of second color of the pixel structure 1216. The second main trace 1204B is electrically connected to the sub-pixel structure 1212R of first color of the pixel structure 1212 and the sub-pixel structure 1212G of second color of the pixel structure 1212.

In an embodiment, the third trace structure 1206 comprises a first main trace 1206A, a second main trace 1206B and/or a third main trace 1206C. The first main trace 1206A, the second main trace 1206B and the third main trace 1206C are disposed in the trace region and surround at least a portion of the transparent region 1207. The first main trace 1206A is electrically connected to the sub-pixel structure 1216G of second color of the pixel structure 1216 and the sub-pixel structure 1216B of third color of the pixel structure 1216. The second main trace 1206B is electrically connected to the sub-pixel structure 1212G of second color of the pixel structure 1212 and the sub-pixel structure 1212B of third color of the pixel structure 1212. The third main trace 1206C is electrically connected to the sub-pixel structure 1212B of third color of the pixel structure 1212 and the sub-pixel structure 1216B of third color of the pixel structure 1216.

The electronic device 1200 may further comprise a data line trace structure and a gate line trace structure.

In an embodiment, the data line trace structure may comprise data lines DL1-DL9, and the gate line trace structure may comprise gate lines GL1-GL3. The data line trace structure extends along a first direction (such as the vertical direction), the gate line trace structure extends along a second direction (such as the horizontal direction), and the first direction and the second direction may be substantially perpendicular to each other. The data line trace structure and the gate line trace structure are disposed in the trace region.

In an embodiment, a position of the opening of the second trace structure 1204 and a position of the opening of the third trace structure 1206 may not be limited as long as the signal of the electronic device 1200 may be normally transferred. For clearly expressed, the electronic device 1200 of FIG. 12 illustrates one layer of trace structure, but the electronic device 1200 may have multi-layers of trace structure.

According to the above embodiments, the present disclosure provides an electronic device. The electronic device comprises a transparent substrate, several pixel structures and a first trace structure. The transparent substrate comprises a transparent region and a trace region. Each of the pixel structures has at least a sub-pixel structure of first color and a sub-pixel structure of second color. The sub-pixel structure of first color has a light emitting element of first color. The sub-pixel structure of second color has a light emitting element of second color. The first trace structure comprises a first main trace, a first auxiliary trace and a second auxiliary trace. The first main trace is disposed in the trace region and surrounds at least a portion of the transparent region. The first auxiliary trace and the second auxiliary trace are electrically connected to the first main trace and are respectively electrically connected to the corresponding sub-pixel structure of first color and the corresponding sub-pixel structure of second color.

According to the above embodiments, the present disclosure provides a transparent display. The transparent display comprises the said electronic device. For instance, the transparent display can be a micro LED display or an OLED display, but the present disclosure is not limited thereto.

The embodiments of the present disclosure can effectively inhibit the diffraction effect or the interference effect, reduce the number and the area of traces and further increase the aperture ratio.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device, comprising:
 a transparent substrate, comprising a plurality of transparent regions and a trace region, wherein the transparent regions are arranged in an array of more than one column and more than one row;
 a plurality of pixel structures, each having at least a sub-pixel structure of first color and a sub-pixel structure of second color, wherein the sub-pixel structure of first color has a light emitting element of first color, the sub-pixel structure of second color has a light emitting element of second color; and
 a first trace structure, comprising a first main trace, a first auxiliary trace, and a second auxiliary trace, wherein the first main trace is disposed in the trace region and surrounds at least a portion of at least one of the transparent regions, the first auxiliary trace and the second auxiliary trace are electrically connected to the first main trace and are respectively electrically connected to a corresponding sub-pixel structure of first color and a corresponding sub-pixel structure of second color, wherein the first auxiliary trace and the second auxiliary trace are located on different straight line directions and are not parallel to each other.

2. The electronic device according to claim 1, wherein the first main trace has an annular structure, the first auxiliary trace and the second auxiliary trace have a segment structure and are located on different straight line directions of the annular structure.

3. The electronic device according to claim 2, wherein:
each of the plurality of pixel structures further comprises a sub-pixel structure of third color, the sub-pixel structure of third color has a light emitting element of third color; and
the first trace structure further comprises a third auxiliary trace, the third auxiliary trace and the first auxiliary trace are located on different sides of the annular structure, the third auxiliary trace is electrically connected to the first main trace and is electrically connected to a corresponding sub-pixel structure of third color.

4. The electronic device according to claim 1, wherein the first main trace has a partial annular structure, the first auxiliary trace and the second auxiliary trace have a segment structure and are located on different sides of the partial annular structure.

5. The electronic device according to claim 1, further comprising:
a data line trace structure and a gate line trace structure, wherein the data line trace structure and the gate line trace structure are disposed in the trace region and surround at least a portion of at least one of the transparent regions;
wherein the data line trace structure extends along a first direction, the gate line trace structure extends along a second direction, the first direction and the second direction are perpendicular to each other.

6. The electronic device according to claim 5, wherein each of the transparent regions is a circular region, an elliptical region, a triangular region, a hexagonal region or a polygonal region, the first main trace corresponds to a shape of the transparent region and is extended as a circle, an ellipse, a triangle, a hexagon or a polygon, and the data line trace structure and the gate line trace structure respectively extend along a boundary of at least one of the transparent regions.

7. The electronic device according to claim 1, further comprising:
a second trace structure, comprising a second main trace, a fourth auxiliary trace and a fifth auxiliary trace, wherein the second main trace is disposed in the trace region and surrounds at least a portion of at least one of the transparent regions, the fourth auxiliary trace and the fifth auxiliary trace are electrically connected to the second main trace and are respectively electrically connected to the sub-pixel structure of first color and the sub-pixel structure of second color;
wherein a projection of the first main trace of the first trace structure and a projection of the second main trace of the second trace structure are not overlapped or are partly overlapped.

8. The electronic device according to claim 7, wherein the first trace structure is one of a first level potential power line trace structure, a second level potential power line trace structure and a compensation setting trace structure, the second trace structure is another one of the first level potential power line trace structure, the second level potential power line trace structure and the compensation setting trace structure.

9. The electronic device according to claim 7, further comprising:
a first contact electrode disposed on a protection layer and electrically connected to the light emitting element of the first color or the second color; and
a transistor electrically connected to one of the first trace structure and the second trace structure, wherein the transistor is further electrically connected to the first contact electrode.

10. The electronic device according to claim 1, wherein the light emitting element of first color and the light emitting element of second color comprise a light-emitting diode (LED), a mini light-emitting diode (mini LED), an organic light-emitting diode (OLED) or a micro light-emitting diode (micro LED).

11. A transparent display, comprising:
an electronic device, comprising:
a transparent substrate, comprising a plurality of transparent regions and a trace region, wherein the transparent regions are arranged in an array of more than one column and more than one row;
a plurality of pixel structures, each having at least a sub-pixel structure of first color and a sub-pixel structure of second color, wherein the sub-pixel structure of first color has a light emitting element of first color, the sub-pixel structure of second color has a light emitting element of second color; and
a first trace structure, comprising a first main trace, a first auxiliary trace, and a second auxiliary trace, wherein the first main trace is disposed in the trace region and surrounds at least a portion of at least one of the transparent regions, the first auxiliary trace and the second auxiliary trace are electrically connected to the first main trace and are respectively electrically connected to a corresponding sub-pixel structure of first color and a corresponding sub-pixel structure of second color, wherein the first auxiliary trace and the second auxiliary trace are located on different straight line directions and are not parallel to each other.

12. The transparent display according to claim 11, wherein the first main trace has an annular structure, the first auxiliary trace and the second auxiliary trace have a segment structure and are located on different straight line directions of the annular structure.

13. The transparent display according to claim 12, wherein:
each of the plurality of pixel structures further comprises a sub-pixel structure of third color, the sub-pixel structure of third color has a light emitting element of third color; and
the first trace structure further comprises a third auxiliary trace, the third auxiliary trace and the first auxiliary trace are located on different sides of the annular structure, the third auxiliary trace is electrically connected to the first main trace and is electrically connected to a corresponding sub-pixel structure of third color.

14. The transparent display according to claim 11, wherein the first main trace has a partial annular structure, the first auxiliary trace and the second auxiliary trace have a segment structure and are located on different sides of the partial annular structure.

15. The transparent display according to claim 11, further comprising:
a data line trace structure and a gate line trace structure, wherein the data line trace structure and the gate line trace structure are disposed in the trace region and surround at least a portion of each of the transparent regions;
wherein the data line trace structure extends along a first direction, the gate line trace structure extends along a second direction, the first direction and the second direction are perpendicular to each other.

16. The transparent display according to claim 15, wherein at least one of the transparent regions is a circular region, an elliptical region, a triangular region, a hexagonal region or a polygonal region, the first main trace corresponds to a shape of the transparent region and is extended as a circle, an ellipse, a triangle, a hexagon or a polygon, and the data line trace structure and the gate line trace structure respectively extend along a boundary of at least one of the transparent regions.

17. The transparent display according to claim 11, further comprising:
   a second trace structure, comprising a second main trace, a fourth auxiliary trace and a fifth auxiliary trace, wherein the second main trace is disposed in the trace region and surrounds at least a portion of at least one of the transparent regions, the fourth auxiliary trace and the fifth auxiliary trace are electrically connected to the second main trace and are respectively electrically connected to the sub-pixel structure of first color and the sub-pixel structure of second color;
   wherein a projection of the first main trace of the first trace structure and a projection of the second main trace of the second trace structure are not overlapped or are partly overlapped.

* * * * *